(12) United States Patent
Jono et al.

(10) Patent No.: US 11,237,227 B2
(45) Date of Patent: Feb. 1, 2022

(54) MAGNETIC SENSOR

(71) Applicant: Konica Minolta, Inc., Tokyo (JP)

(72) Inventors: Junichi Jono, Tokyo (JP); Koujirou Sekine, Ibaraki (JP); Masaaki Tsuchida, Hachioji (JP)

(73) Assignee: Konica Minolta, Inc., Tokyo (JP)

( * ) Notice: Subject to any disclaimer, the term of this patent is extended or adjusted under 35 U.S.C. 154(b) by 168 days.

(21) Appl. No.: 16/606,881

(22) PCT Filed: Apr. 24, 2018

(86) PCT No.: PCT/JP2018/016557
§ 371 (c)(1),
(2) Date: Oct. 21, 2019

(87) PCT Pub. No.: WO2018/199068
PCT Pub. Date: Nov. 1, 2018

(65) Prior Publication Data
US 2021/0103013 A1    Apr. 8, 2021

(30) Foreign Application Priority Data

Apr. 25, 2017  (JP) ............................ JP2017-086368

(51) Int. Cl.
*G01R 33/09*     (2006.01)
*G01R 33/02*     (2006.01)
(Continued)

(52) U.S. Cl.
CPC ............. *G01R 33/09* (2013.01); *G01N 27/72* (2013.01); *G01R 33/0206* (2013.01); *G01R 33/10* (2013.01)

(58) Field of Classification Search
CPC .... G01R 33/09; G01R 33/0206; G01R 33/10; G01R 33/0005; G01R 33/091; G01N 27/72
(Continued)

(56) References Cited

U.S. PATENT DOCUMENTS

| 4,079,360 A * | 3/1978 | Ookubo ................ G01D 5/145 |
| | | 235/449 |
| 6,535,108 B1 * | 3/2003 | Schrott ................ G01S 13/753 |
| | | 235/380 |

(Continued)

FOREIGN PATENT DOCUMENTS

| CN | 105929345 A | 9/2016 |
| JP | 2003-502876 A | 1/2003 |

(Continued)

OTHER PUBLICATIONS

International Patent Application No. PCT/JP2018/016557; Int'l Preliminary Report on Patentability; dated Oct. 29, 2019; 10 pages.

(Continued)

*Primary Examiner* — Christopher P McAndrew
(74) *Attorney, Agent, or Firm* — BakerHostetler (57) ABSTRACT

A magnetic sensor includes a plurality of magnetoresistive element units. Each of the magnetoresistive element units includes a flat-surface-type first magnetoresistive element having a detection axis in a first direction and a flat-surface-type second magnetoresistive element having a detection axis in a second direction different from the first direction. The first magnetoresistive element and the second magnetoresistive element are arranged so as to face each other. The plurality of magnetoresistive element units are arrayed in a direction orthogonal to flat surfaces of the first magnetoresistive element and the second magnetoresistive element. The surfaces facing a measurement sample constitute a (Continued)

surface parallel to the direction in which the magnetoresistive element units are arrayed.

9 Claims, 7 Drawing Sheets

(51) Int. Cl.
G01R 33/10 (2006.01)
G01N 27/72 (2006.01)

(58) Field of Classification Search
USPC ........................................... 324/252
See application file for complete search history.

(56) References Cited

U.S. PATENT DOCUMENTS

| | | | | |
|---|---|---|---|---|
| 6,822,443 B1* | 11/2004 | Dogaru | ............... | G01R 33/093 324/235 |
| 7,157,905 B1* | 1/2007 | Minamitani | ............ | G07D 7/04 324/207.21 |
| 2006/0006334 A1* | 1/2006 | Kadono | ............... | B82Y 10/00 250/338.2 |
| 2012/0038351 A1* | 2/2012 | Saruki | ................... | G01D 5/145 324/207.25 |
| 2012/0153947 A1* | 6/2012 | Ausserlechner | ......... | G01B 7/30 324/252 |
| 2013/0300402 A1* | 11/2013 | Liu | ...................... | G01R 33/093 324/202 |
| 2014/0015525 A1* | 1/2014 | Paci | ................... | G01R 33/0052 324/252 |
| 2015/0263270 A1* | 9/2015 | Kitagawa | .............. | G11C 11/161 257/421 |
| 2016/0178397 A1* | 6/2016 | Jost | .................... | G01R 33/0052 324/207.12 |
| 2017/0123016 A1* | 5/2017 | Deak | .................. | G01R 33/0011 |
| 2017/0176545 A1* | 6/2017 | Deak | .................. | G01R 33/0206 |
| 2017/0184635 A1* | 6/2017 | Ugge | ................... | G01R 15/207 |
| 2019/0368858 A1* | 12/2019 | Deak | ....................... | G01B 7/30 |
| 2020/0041310 A1* | 2/2020 | Lassalle-Balier | ........ | G01D 5/16 |

FOREIGN PATENT DOCUMENTS

| | | |
|---|---|---|
| JP | 2003-529199 A | 9/2003 |
| JP | 2009-168796 A | 7/2009 |
| JP | 2012-110470 | 6/2012 |
| JP | 2014-016161 A | 1/2014 |
| JP | 2017-026312 | 2/2017 |

OTHER PUBLICATIONS

International Search Report issued in Parent PCT Appln. PCT/JP2018/016557 dated Jul. 24, 2018.
China Patent Application No. 201880027218.2; Office Action; dated May 20, 2021; 22 pages.

* cited by examiner

FIG.9

MAGNETIC SENSOR

CROSS-REFERENCE TO RELATED APPLICATIONS

This application is a national stage entry according to 35 U.S.C. 371 of PCT Application No. PCT/JP2018/016557 filed on Apr. 24, 2018, which claims priority to Japanese Patent Application No. 2017-086368 filed on Apr. 25, 2017, which are entirely incorporated herein by reference.

TECHNICAL FIELD

The present invention relates to a magnetic sensor.

BACKGROUND ART

As a technique for non-destructively measuring a conductive structure or a function inside a living body, a method of measuring the intensity distribution of a slight magnetic field generated by current flowing inside is known. Such a measurement method uses a magnetic sensor capable of detecting a minute magnetic field, for example, a magnetic sensor with a coil or a magnetic sensor (magnetoresistive element) in which a magnetic material is formed into a thin film.

Here, to measure the intensity of the three-dimensional (X-axis direction, Y-axis direction, and Z-axis direction) magnetic field by using the aforementioned magnetoresistive element, a magnetoresistive element is generally required for each measurement axis. Although it is possible to calculate the magnetic field intensity for one of the three axes from the magnetic field intensity of the other two axes, a magnetoresistive element that detects the magnetic field intensity for at least two axes is required. Magnetoresistive elements that detect magnetic field intensities in different axial directions must be physically separated from each other, a and the intensities of the three-dimensional magnetic field at specific coordinates are acquired based on the detection results provided by each magnetoresistive element (see Patent Literature 1, for example).

However, as the measurement sample becomes smaller, the difference in position between the magnetoresistive elements becomes more noticeable, and these shifts in position, that is, shifts in the detection position may become problematic. Examples of method for addressing such a problem include a method in which shifts in the positions of magnetoresistive elements are corrected by sequentially moving the magnetoresistive elements to the same position by using a moving stage or the like to perform measurement (See Patent Literature 2, for example).

Moreover, in order to measure the magnetic field distribution of a measurement sample by using the aforementioned magnetoresistive element, it is necessary, for example, to array a plurality of magnetoresistive elements on a flat-plate-like substrate so that they are arrayed in parallel to the substrate, and detect magnetic field intensities over a wide area (see Patent Literature 2, for example).

CITATION LIST

Patent Literature

Patent Literature 1: JP 2017-26312A
Patent Literature 2: Japanese Patent No. 5626678

SUMMARY OF INVENTION

Technical Problem

However, with the aforementioned conventional technique, measurement is performed while moving the magnetoresistive elements and it therefore takes time to complete the measurement, and the intensity of the magnetic field of each component at the same timing cannot be detected, so that magnetic field information with high accuracy cannot be acquired.

Further, in the aforementioned conventional technique, a plurality of magnetoresistive elements are arrayed in parallel to the substrate. However, since the magnetoresistive elements have a certain area along the surface direction, there is a limitation on the number of magnetoresistive elements per unit area of the substrate, and magnetic field information cannot be acquired with high spatial resolution.

Therefore, an object of the present invention is to provide a magnetic sensor that can suppress shifts in detection position and detection timing by magnetoresistive elements and enables measurement with high accuracy and high spatial resolution.

Solution to Problem

To solve the aforementioned problem, the invention according to Claim 1 is a magnetic sensor in which a plurality of magnetoresistive element units, in each of which a flat-surface-type first magnetoresistive element having a detection axis in a first direction and a flat-surface-type second magnetoresistive element having a detection axis in a second direction different from the first direction are arranged so as to face each other, are arrayed in a direction orthogonal to flat surfaces of the first magnetoresistive element and the second magnetoresistive element; and the surfaces facing a measurement sample constitute a surface parallel to the direction in which the magnetoresistive element units are arrayed.

The invention according to Claim 2 is the magnetic sensor according to Claim 1, in which an insulating layer is provided between the first magnetoresistive element and the second magnetoresistive element.

The invention according to Claim 3 is the magnetic sensor according to Claim 1 or 2, in which the magnetoresistive element units adjacent in the array direction are in contact with each other.

The invention according to Claim 4 is the magnetic sensor according to any one of Claims 1 to 3, in which a part of a substrate constituting the magnetoresistive element unit and a part of a substrate constituting the adjacent magnetoresistive element unit are arranged so as to overlap with each other in a direction orthogonal to the array direction.

The invention according to Claim 5 is the magnetic sensor according to any one of Claims 1 to 3, in which a first magnetic thin film having a detection axis in the first direction and a second magnetic thin film having a detection axis in the second direction are provided on both surfaces of each substrate, whereby the first magnetoresistive element and the second magnetoresistive element are formed, and the plurality of substrates are arrayed so that a surface adjacent to the first magnetic thin film and a surface adjacent to the second magnetic thin film face each other, whereby the plurality of magnetoresistive element units are formed.

The invention according to Claim 6 is the magnetic sensor according to any one of Claims 1 to 5, further comprising a computing unit that derives a magnetic field intensity in the array direction on the basis of detection results given by the plurality of magnetoresistive element units.

The invention according to Claim 7 is the magnetic sensor according to any one of Claims 1 to 6, further comprising: an external magnetoresistive element that detects external magnetic field intensity; and a specifying unit that specifies a noise component caused by an external environment on the basis of detection results given by the external magnetoresistive element.

The invention according to Claim 8 is the magnetic sensor according to any one of Claims 1 to 7, further comprising a plurality of peripheral magnetoresistive elements distributed around the plurality of magnetoresistive element units.

Advantageous Effects of Invention

The present invention can provide a magnetic sensor that can suppress shifts in detection position and detection timing by magnetoresistive elements and enables measurement with high accuracy and high spatial resolution.

DESCRIPTION OF EMBODIMENTS

Embodiments for carrying out the present invention will now be described with reference to the accompanying drawings. Although various technically preferable limitations for carrying out the present invention are given to the embodiments described below, the scope of the invention is not limited to the following embodiments and examples shown in the drawings.

First Embodiment

Figure 1:
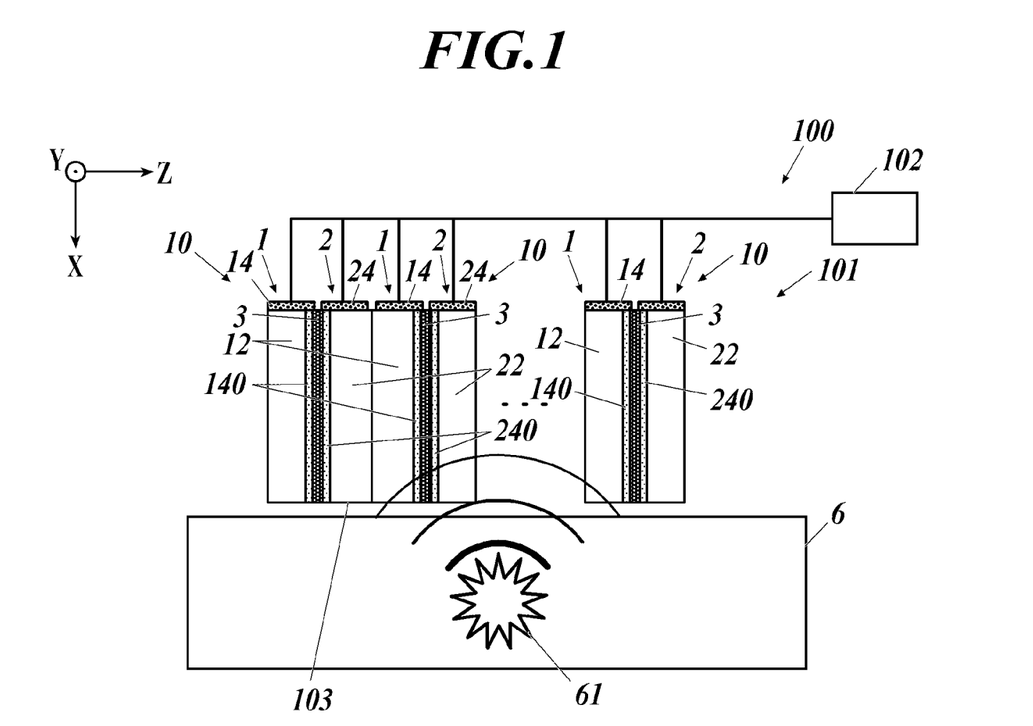
FIG. 1 is a schematic configuration diagram showing a magnetic sensor according to the first embodiment.
Figure 2A:
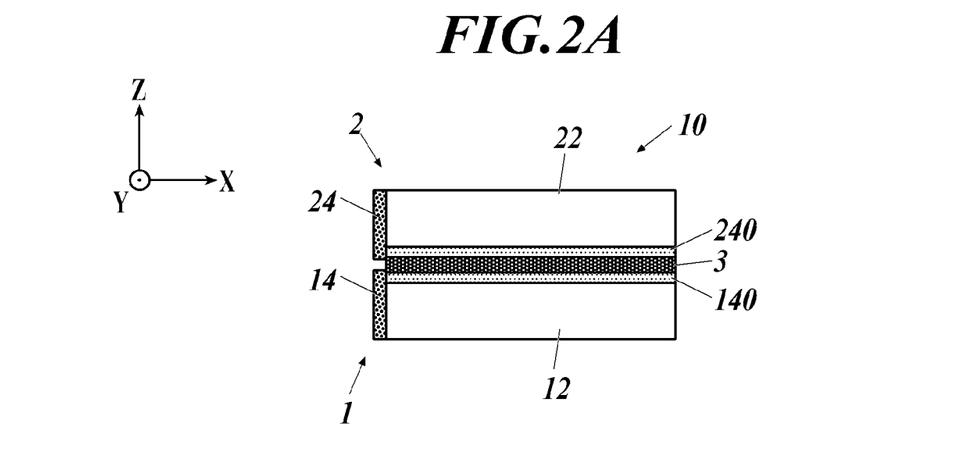
FIG. 2A is a front view showing a schematic configuration of a magnetoresistive element unit.
Figure 2B:
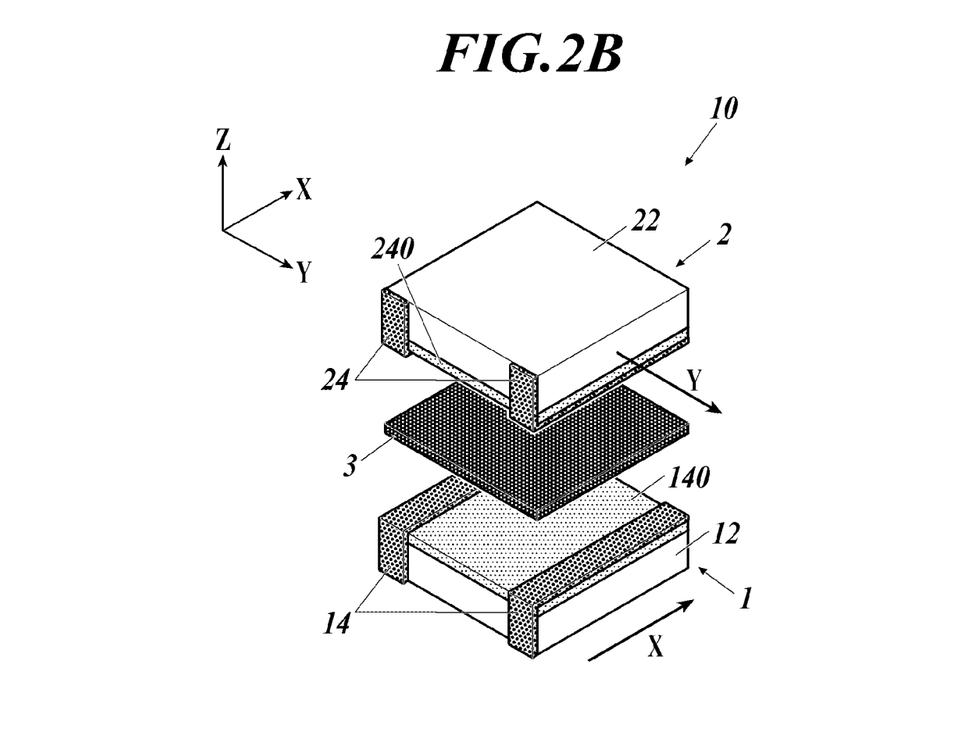
FIG. 2B is an exploded perspective view showing a schematic configuration of the magnetoresistive element unit.
Figure 3:
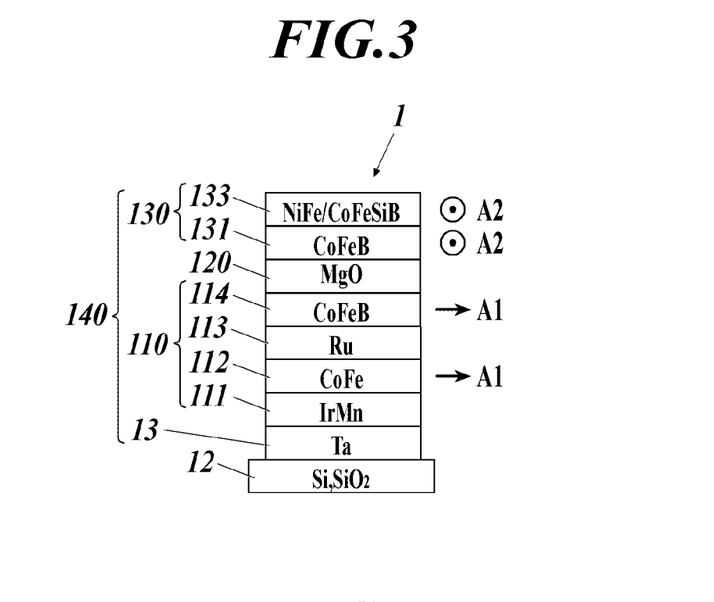
FIG. 3 is a schematic diagram showing a laminated structure of the first magnetoresistive element.
Figure 4:
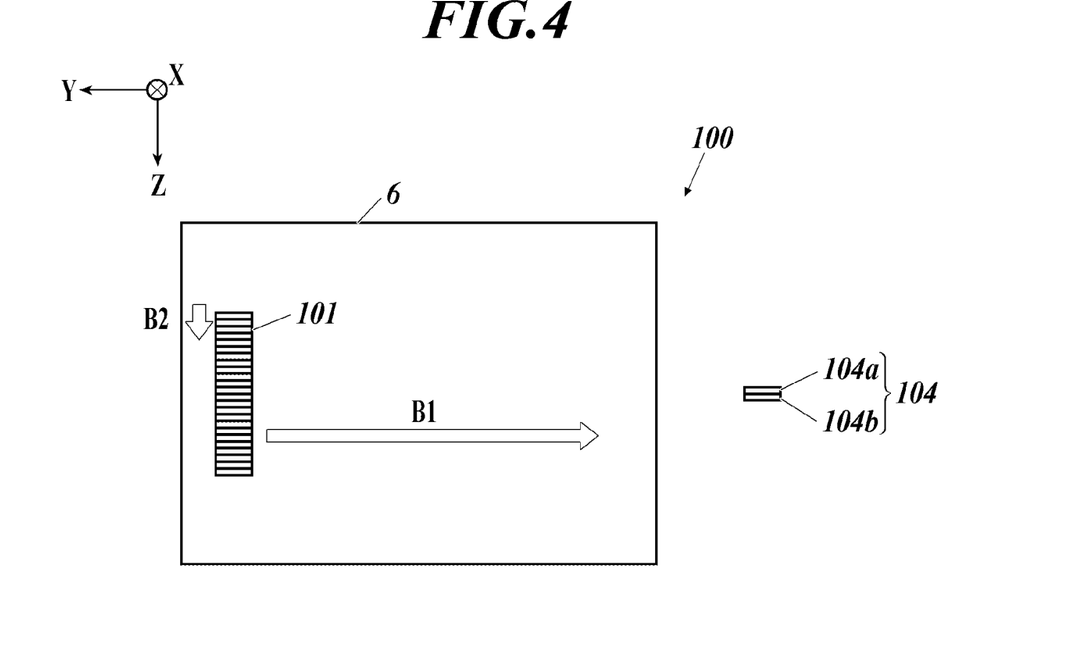
FIG. 4 is a plan view showing a schematic configuration of the magnetic sensor according to the first embodiment.

The magnetic sensor 100 according to the first embodiment will be described with reference to FIGS. 1 to 4. FIG. 1 is a schematic configuration diagram showing a magnetic sensor 100 according to the first embodiment. FIGS. 2A and 2B are schematic configuration diagrams of the magnetoresistive element unit 10. FIG. 2A is a front view seen from the surface direction of the magnetoresistive element unit 10, and FIG. 2B is an exploded perspective view of the magnetoresistive element unit 10. FIG. 3 is a schematic diagram showing a laminated structure of a first magnetoresistive element 1. FIG. 4 is a plan view showing a schematic configuration of a magnetic sensor 100 and a measurement sample 6. In FIG. 1, the reference sensor 104 is not shown, and in FIG. 4, the controller 102 is not shown.

As shown in FIG. 1, the magnetic sensor 100 includes a laminate 101 in which a plurality of magnetoresistive element units 10, in each of which a flat-surface-type first magnetoresistive element 1 having a detection axis in a first direction and a flat-surface-type second magnetoresistive element 2 having a detection axis in a second direction different from the first direction are arranged so as to face each other, are arrayed in a direction orthogonal to flat surfaces of the first and second magnetoresistive elements 1 and 2; a reference sensor 104 provided in a position away from a measurement sample 6; and a controller 102 that derives the magnetic field intensity in the array direction based on the detection results given by the first and second magnetoresistive elements 1 and 2 and identifies a noise component caused by the external environment based on the detection results given by the reference sensor 104. The surface of the magnetic sensor 100 which faces the measurement sample 6 is a surface 103 parallel to the array direction of the laminate 101.

Here, in the following description, a specific direction in the plane of the first and second magnetoresistive elements 1 and 2 is the X direction, the direction orthogonal to the X direction in the plane is the Y direction, the direction orthogonal to the X direction and Y direction (the array direction of the first and second magnetoresistive elements 1 and 2) is the Z direction.

As shown in FIG. 1, the plurality of magnetoresistive element units 10 are arrayed so that the magnetoresistive element units 10 adjacent in the array direction are in contact with each other. In addition, as shown in FIGS. 2A and 2B, the magnetoresistive element unit 10 is a laminate of a first magnetoresistive element 1, a second magnetoresistive element 2, and an insulating layer 3 provided therebetween. The first magnetoresistive element 1 includes a silicon substrate 12, a first magnetic thin film 140, and an electrode layer 14, and the second magnetoresistive element 2 includes a silicon substrate 22, a second magnetic thin film 240, and an electrode layer 24. The first and second magnetoresistive elements 1 and 2 are disposed such that the surface adjacent to the first magnetic thin film 140 and the surface adjacent to the second magnetic thin film 240 face each other.

As shown in FIG. 3, the first magnetoresistive element 1 is a tunnel magnetoresistive element (TMR element) that forms a magnetic tunnel junction through a fixed magnetic layer 110 the magnetization direction of which is fixed, a free magnetic layer 130 the magnetization direction of which changes under the influence of an external magnetic field, and an insulating layer 120 disposed between the fixed magnetic layer 110 and the free magnetic layer 130 and changes the resistance of the insulating layer 120 by tunneling according to the angular difference between the magnetization direction of the fixed magnetic layer 110 and the magnetization direction of the free magnetic layer 130.

The first magnetoresistive element 1 has, for example, a layered structure including a silicon substrate (Si, $SiO_2$) 12 coated with a base layer (Ta) 13 overlaid with a fixed magnetic layer 110, which has, from below, an antiferromagnetic layer (IrMn) 111, a ferromagnetic layer (CoFe) 112, a magnetic coupling layer (Ru) 113, and a ferromagnetic layer (CoFeB) 114, overlaid with an insulating layer (MgO) 120 overlaid with a free magnetic layer 130, which has, from below, a ferromagnetic layer (CoFeB) 131 and a soft magnetic layer (NiFe or CoFeSi) 133. The base layer 13, fixed magnetic layer 110, insulating layer 120, and free magnetic layer 130 constitute a first magnetic thin film 140. The layer configuration of the first magnetoresistive element 1 and the material of each layer are not limited to these, and any known layer configuration and material may be used; for example, a magnetic coupling layer (Ru) may be further provided between the ferromagnetic layer 131 and the soft magnetic layer 133.

In the first magnetoresistive element 1 configured as described above, when the detection magnetic field is zero, the magnetization direction of the fixed magnetic layer 110 and the magnetization direction of the free magnetic layer 130 are twisted and stable at approximately 90 degrees. This is because each is magnetized in the direction of the magnetization easy axis. In particular, the first magnetoresistive element 1 is formed in a position where the direction A2 of the magnetization easy axis of the free magnetic layer 130 is twisted by approximately 90 degrees with respect to the magnetization easy axis A1 of the fixed magnetic layer 110.

For example, when the external magnetic field opposite to the magnetization direction of the fixed magnetic layer 110 is applied to the first magnetoresistive element 1, the magnetization direction of the free magnetic layer 130 spins in the direction opposite to the magnetization direction of the fixed magnetic layer 110, and the tunneling increases the resistance of the insulating layer 120. In contrast, when the external magnetic field in the same direction as the magnetization direction of the fixed magnetic layer 110 is applied to the first magnetoresistive element 1, the magnetization direction of the free magnetic layer 130 spins in the direction same as the magnetization direction of the fixed magnetic layer 110, and the tunneling decreases the resistance of the insulating layer 120. The magnetic field intensity applied from the outside is electrically read through the electrode layer 14 as the amount of change in the resistance as described above, thereby detecting the magnetic field intensity through the first magnetoresistive element 1.

The second magnetoresistive element 2 has the same configuration as the first magnetoresistive element 1 except the direction of the detection axis. To be specific, as shown in FIGS. 2A and 2B, the first magnetoresistive element 1 has the detection axis in the X direction because the magnetization direction of the fixed magnetic layer 110 is the X direction, whereas the second magnetoresistive element 2 has the detection axis in the Y direction because the magnetization direction of the fixed magnetic layer (not shown) is the Y direction.

A vector component is obtained from the detection results given by the first and second magnetoresistive elements 1 and 2, so that the magnetoresistive element unit 10 functions as a magnetic sensor that is sensitive to the surface direction of the first and second magnetoresistive elements 1 and 2. Further, the first and second magnetoresistive elements 1 and 2 are disposed in the state where the surface adjacent to the first magnetic thin film 140 faces the surface adjacent to the second magnetic thin film 240, so that the magnetic field detection portions of the first and second magnetoresistive elements 1 and 2 can be brought close to each other, which can suppress shifts in the detection positions of the first and second magnetoresistive elements 1 and 2. Hence, the magnetic sensor 100 can simultaneously capture the magnetic field intensities of the detection axes of the first and second magnetoresistive elements 1 and 2 and can acquire two-dimensional magnetic field information at high speed and accurately.

The insulating layer 3 is provided between the first magnetoresistive element 1 and the second magnetoresistive element 2, and consists of an insulating sheet that is composed of an insulating material (for example, $SiO_2$) and is provided with adhesive layers, which are used for adhesion to the first and second magnetoresistive elements 1 and 2, on its both surfaces, respectively. This prevents direct contact between the surface of the first magnetoresistive element 1 adjacent to the first magnetic thin film 140 and the surface of the second magnetoresistive element 2 adjacent to the second magnetic thin film 240 and bonds them for integration. Since the first magnetoresistive element 1 and the second magnetoresistive element 2 can be brought close to each other on the order of several micrometers, the two-component magnetic field intensity can be detected accurately and at high speed. The adhesive layer can be composed of, for example, a thermosetting resin. Note that the insulating layer 3 may be composed of an insulating adhesive layer without including an insulating sheet.

In the reference sensor 104, external magnetoresistive elements 104a and 104b that detect the magnetic field intensity in the external environment of the measurement sample 6 face each other with an insulating layer (not shown) therebetween. The external magnetoresistive element 104a has the same configuration as the first magnetoresistive element 1, and the external magnetoresistive element 104b has the same configuration as the second magnetoresistive element 2. In other words, as shown in FIG. 4, the reference sensor 104 has the same configuration as the magnetoresistive element unit 10 except that it is provided away from the laminate 101 and the measurement sample 6.

The controller 102 acquires the magnetic field intensity in the X direction and the Y direction detected by each magnetoresistive element unit 10, and the magnetic field intensity in the array direction (Z direction) can be calculated based on the difference between the acquired magnetic field intensity of the units. Hence, the magnetic sensor 100 can derive the three-dimensional magnetic field information on the measurement sample 6.

Further, the controller 102 specifies a noise component caused by the external environment, based on the detection results given by the external magnetoresistive elements 104a and 104b constituting the reference sensor 104. To be specific, for example, when noise caused by the external environment (environmental noise), which is from the outside of the measurement sample 6, is generated, the phase and intensity of the detected environmental noise are substantially equal in all the magnetoresistive element units 10 and the reference sensor 104; thus, the controller 102 can specify the fact that a signal waveform common to these detection results is environmental noise. Therefore, the controller 102 subtracts the environmental noise from the magnetic field intensity (in which magnetic field information on the measurement sample 6 and magnetic field information as environmental noise are mixed) detected by each magnetoresistive element unit 10, thereby providing magnetic field information with higher accuracy.

Further, when there is a source of environmental noise near the measurement sample 6, the intensities of the environmental noise detected by each magnetoresistive element unit 10 and the reference sensor 104 are different. In that case, the controller 102 weights the outputs of each magnetoresistive element unit 10 and the reference sensor 104 based on multivariate analysis (for example, principal component analysis), specifies the environmental noise component, and subtracts it from the measurement results, thereby providing magnetic field information with higher accuracy.

Here, if the environmental noise has high intensity, when the output signals from each magnetoresistive element unit 10 and the reference sensor 104 are amplified by an amplifier (not shown), the signals are saturated, which may make measurement impossible or decrease the accuracy. It is therefore preferable to set the dynamic range of the reference sensor 104 wide (specifically, reduce the gain of the amplifier) so that even environmental noise with high intensity falls within the measurement range and how much environmental noise is mixed can be recognized. It is also preferable that the controller 102 feedback the gain of the amplifier of the magnetoresistive element unit 10 based on the detection results given by the reference sensor 104 for resetting to an appropriate amplification factor.

To detect the magnetic field intensity of the measurement sample 6 by using the magnetic sensor 100 having the configuration described above, the surface 103 parallel to the direction in which the magnetoresistive element units 10 are arrayed is brought close to the measurement sample 6. Thus, a plurality of first and second magnetoresistive elements 1 and 2 can be arrayed more densely with respect to the measurement sample 6 than in the case where the first and second magnetoresistive elements 1 and 2 are arranged so that the surface adjacent to the first magnetic thin film 140 and the surface adjacent to the second magnetic thin film 240 face the measurement sample 6, respectively. Therefore, the distribution of the magnetic field generated by the measurement sample 6 can be simultaneously measured with high spatial resolution. For this reason, such a magnetic sensor 100 is very useful for detecting an abnormal metal 61 generated inside the measurement sample 6 in the case where the measurement sample 6 is a flat-surface-type thin lithium ion battery or the like.

Here, the sizes of the magnetic field detection portions of the first and second magnetoresistive elements 1 and 2 are generally such that the length of one side in the in-plane direction is, for example, in the range of several tens of micrometers to several millimeters. The sizes of the magnetic field detection portions affect the S/N ratios and spatial resolutions of the first and second magnetoresistive elements 1 and 2.

Meanwhile, when the measurement sample 6 is a flat plate, its size is generally such that the length of one side is, for example, within the range of several centimeters to several meters. The thickness of the measurement sample 6 is generally in the range of several hundred micrometers to several centimeters. When the measurement sample 6 is, for example, a laminate-type lithium ion battery, the length of one side is generally within the range of 10 to 30 cm. When the measurement sample 6 is a test sample of, for example, an aluminum plate or a carbon steel plate, the length of one side is generally within the range of 20 to 100 cm, sometimes several meters.

The spatial resolution of the first magnetoresistive element 1 alone depends on the relative size to the abnormal metal 61 present in the measurement sample 6. For example, to detect a rough position of the approximately spherical abnormal metal 61 having a diameter ϕ of about 100 μm, it is preferable to set the length of one side of the first magnetoresistive element 1 within the range of approximately the same as the diameter of the abnormal metal 61 (about 100 μm) to about 100 times the diameter of the abnormal metal 61 (about 10 mm). For example, to accurately detect the position of the abnormal metal 61 having a diameter ϕ of about 100 μm, it is preferable to set the length of one side of the first magnetoresistive element 1 within the range of approximately the same as the diameter of the abnormal metal 61 (about 100 μm) to about 10 times the diameter of the abnormal metal 61 (about 1 mm). Note that the same applies to the second magnetoresistive element 2.

As shown in FIG. 4, when measurement is performed using the magnetic sensor 100, the laminate 101 and the measurement sample 6 may be moved relatively to each other. For example, the magnetic field distribution of the whole area of the measurement sample 6 in the Y direction can be acquired by running the laminate 101 in the direction B1 shown in FIG. 4 by a predetermined distance and detecting the magnetic field intensity in measurement positions separated by the predetermined distance. In this case, the spatial resolution in the Y direction can be enhanced by shortening the distance between the measurement positions. Alternatively, after the laminate 101 is run in the direction B1 to measure the whole area of the measurement sample 6 in the Y direction, measurement is performed while running it in the direction B2 shown in FIG. 4 by a predetermined distance and then running it in the direction B1 again, thereby allowing a wider field to be measured for magnetic field distribution and enhancing the spatial resolution in the Z direction. Alternatively, the magnetic field distribution of the measurement sample 6 can be measured in more detail by performing the measurement while miming the laminate 101 in the X direction by a predetermined distance and then miming it in the directions B1 and B2 again.

It should be noted that the measurement may be performed using a plurality of magnetic sensors 100, or moving the plurality of magnetic sensors 100 relatively to the measurement sample. Alternatively, the measurement sample 6 may be moved while the position of the magnetic sensor 100 is fixed.

As described above, in the magnetic sensor 100 according to the first embodiment, a plurality of magnetoresistive element units 10, in each of which a flat-surface-type first magnetoresistive element 1 having a detection axis in a first direction and a flat-surface-type second magnetoresistive element 2 having a detection axis in a second direction different from the first direction are arranged so as to face each other, are arrayed in a direction orthogonal to flat surfaces of the first and second magnetoresistive elements 1 and 2; and the surface facing the measurement sample 6 is the surface 103 parallel to the direction in which the magnetoresistive element units 10 are arrayed; therefore, the plurality of magnetoresistive elements can be arrayed densely with respect to the measurement sample. Hence, shifts in the detection position of each magnetoresistive element can be suppressed and shifts in the detection timing can also be suppressed by simultaneously detecting the magnetic field intensity through the arrayed magnetoresistive elements. Therefore, measurement can be performed with high accuracy and high spatial resolution.

Since the insulating layer 3 is provided between first magnetoresistive element 1 and the second magnetoresistive element 2, the first magnetoresistive element 1 and the second magnetoresistive element 2 can be brought close to each other on the order of several micrometers; thus, the magnetic field intensity can be detected accurately and at high speed.

Since the magnetoresistive element units 10 adjacent in the array direction are in contact with each other, measurement can be performed with higher spatial resolution.

Since the controller 102 that derives the magnetic field intensity in the array direction based on the detection results given by the plurality of magnetoresistive element units 10 is provided, three-dimensional magnetic field information can be acquired.

Since the external magnetoresistive elements 104a and 104b that detect the external magnetic field intensity and the controller 102 that identifies the noise component caused by the external environment on the basis of the detection results given by the external magnetoresistive elements 104a and 104b are provided, the noise component can be removed from the magnetic field intensity detected by the magnetoresistive element units 10, magnetic field information can be obtained with higher accuracy.

Although the surface of the first magnetoresistive element 1 adjacent to the first magnetic thin film 140 faces the surface of the second magnetoresistive element 2 adjacent to the second magnetic thin film 240 in each magnetoresistive element unit 10 in the first embodiment described above, this is not necessarily the case. In other words, the surface of the first magnetoresistive element 1 remote from the first magnetic thin film 140 may face the surface of the second magnetoresistive element 2 adjacent to the second magnetic thin film 240 in the magnetoresistive element unit. In this case, an array is formed so that the surface of the first magnetoresistive element 1 adjacent to the first magnetic thin film 140 and the surface of the second magnetoresistive element 2 adjacent to the second magnetic thin film 240 face one direction, thereby forming a laminate.

Although the magnetoresistive element units 10 adjacent in the array direction are in contact with each other in the first embodiment described above, this is not necessarily the case, and the adjacent magnetoresistive element units 10 may be not in contact with each other or may be arrayed with a gap therebetween. In this case, to perform measurement with higher spatial resolution, the smaller the gap, the better.

Although the first and second magnetoresistive elements 1 and 2 are tunnel magnetoresistive elements in the first embodiment, they may be any flat-surface-type elements; for example, they may be anisotropic magneto resistive effect (AMR) elements, giant magneto resistive effect (GMR) elements, or the like.

Although the first magnetoresistive element 1 has a detection axis in the X direction, and the second magnetoresistive element 2 has a detection axis in the Y direction, that is, the direction of the detection axis of the first magnetoresistive element 1 and the direction of the detection axis of the second magnetoresistive element 2 are twisted 90 degrees in the plane directions of the first and second magnetoresistive elements 1 and 2 in the first embodiment described above, this is not necessarily the case. For example, the first magnetoresistive element 1 may have a detection axis in the Y direction, and the second magnetoresistive element 2 may have a detection axis in the X direction, and the angle between the direction of the detection axis of the first magnetoresistive element 1 and the direction of the detection axis of the second magnetoresistive element 2 may be less than 90 degrees.

Although the insulating layer 3 is provided between the first magnetoresistive element 1 and the second magnetoresistive element 2 that are arranged so as to face each other in the first embodiment described above, the insulating layer 3 may not be provided. In this case, it is preferable that the first magnetoresistive element 1 and the second magnetoresistive element 2 be fixed with a gap therebetween so that they are not in contact with each other. Further, in order to suppress shifts in the detection position of each magnetoresistive element, the gap is preferably as small as possible.

Although a plurality of magnetoresistive element units 10 are arrayed in the Z direction in the laminate 101 in the first embodiment described above, the magnetoresistive element units facing the same direction may also be arrayed in the direction orthogonal to the array direction (Y direction) so that the surface 103 may be large in the said direction. In this case, making the size of the first and second magnetoresistive elements 1 and 2 smaller in the plane direction can further increase the spatial resolution in the direction orthogonal to the array direction (Y direction).

Although the reference sensor 104 has the same configuration as the magnetoresistive element units 10 in the first embodiment described above, this is not necessarily the case. For example, since it is only necessary to extract the feature quantity of the environmental noise through each magnetoresistive element unit 10 and the reference sensor 104, only one of the external magnetoresistive elements 104a and 104b may be provided and the configurations of the external magnetoresistive elements 104a and 104b may be different from those of the first and second magnetoresistive elements 1 and 2, respectively.

Although the reference sensor 104 is provided for the purpose of removing environmental noise in the first embodiment described above, this is not necessarily the case; for example, the reference sensor 104 may not be necessarily provided in the following cases.

For example, when the magnetic field intensity of the measurement sample 6 is very low and environmental noise is an impediment to measurement, the laminate 101 may be covered by a cylindrical or box-shaped magnetic shield (not shown) to reduce the intensity of the environmental noise detected by the laminate 101. The magnetic shield consists of, for example, a combination of plate-like or sheet-like members containing an iron mixed material such as NiFe or CoFeSiB having high magnetic permeability.

Aside from that, for example, if current can be applied to the measurement sample 6, current in a frequency band different from that of the environmental noise is applied to the measurement sample 6, and the magnetic field generated by the current is measured, so that the environmental noise and the magnetic field intensity of the measurement sample 6 can be distinguished by the frequency. For example, the frequency of a commercial power supply often cited as environmental noise is 50 Hz, 60 Hz, or a multiple thereof; for example, since 70 Hz does not overlap with those frequency bands, a current of 70 Hz is applied to the measurement sample 6.

For another example, when the environmental noise is always constant, measurement is performed using the magnetic sensor 100 in the state where the measurement sample 6 is not installed as a reference in advance, measurement is then performed with the measurement sample 6 installed, and the reference is subtracted from the measurement result, thereby removing environmental noise.

Second Embodiment

The second embodiment of the magnetic sensor of the present invention will be described below with reference to FIG. 5 and FIGS. 6A and 6B. Since the configuration other than that described below is substantially the same as that of the magnetic sensor 100 of the first embodiment, the same components are denoted by the same reference numerals and detailed description thereof will be omitted.

Figure 5:
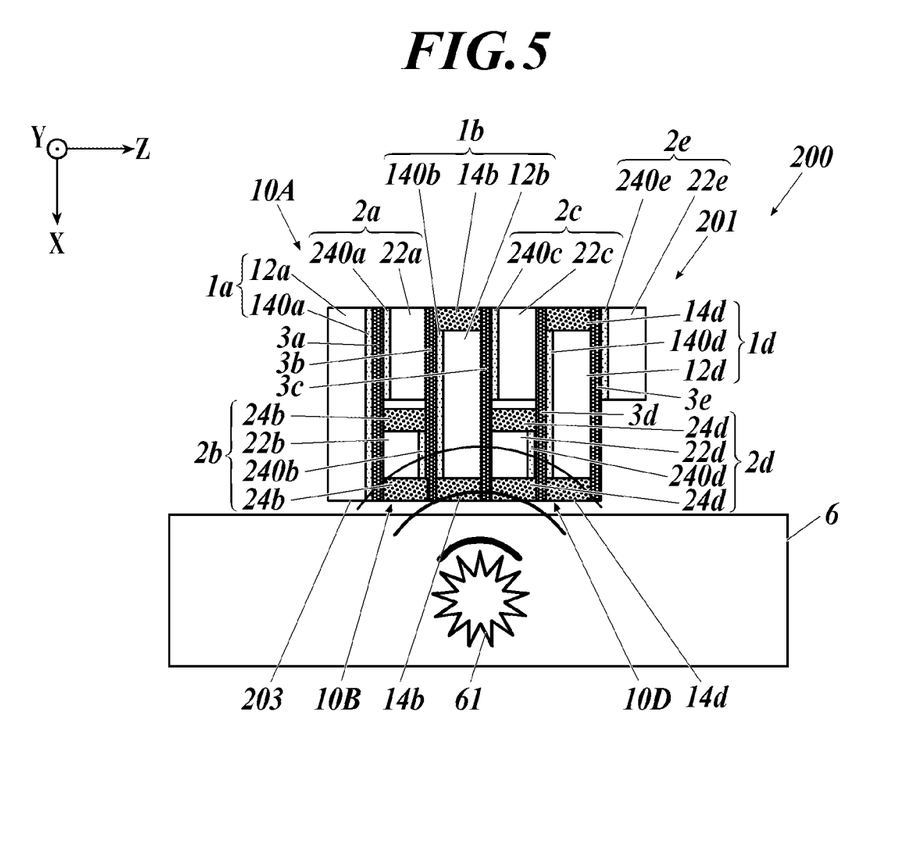
FIG. 5 is a schematic configuration diagram showing a magnetic sensor according to the second embodiment.
Figure 6A:
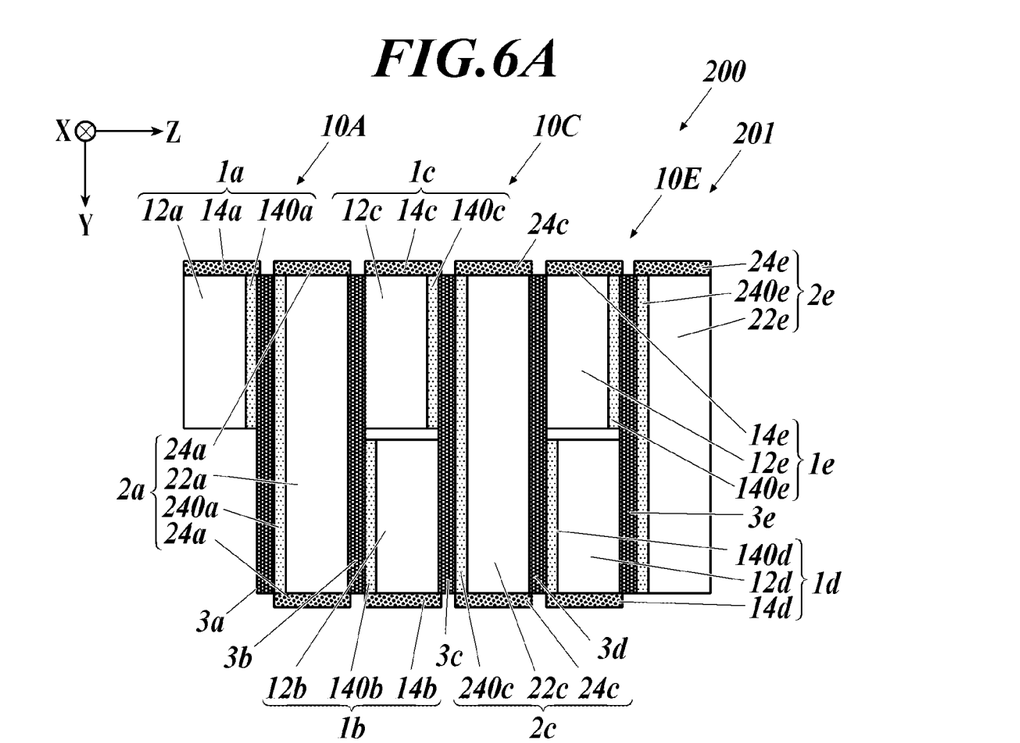
FIG. 6A is a plan view showing a schematic configuration of the magnetic sensor of according to the second embodiment.
Figure 6B:
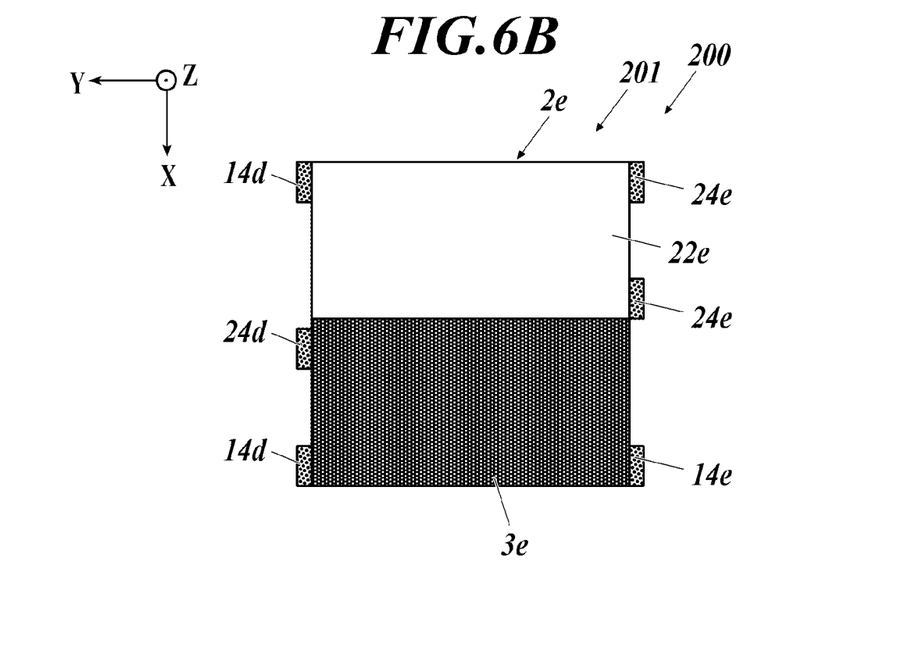
FIG. 6B is a side view showing a schematic configuration of the magnetic sensor according to the second embodiment.

FIG. 5 is a schematic configuration diagram showing a magnetic sensor 200 of the second embodiment. FIGS. 6A and 6B are schematic configuration diagrams showing the magnetic sensor 200: FIG. 6A is a plan view of the magnetic sensor 200 viewed from the X direction, and FIG. 6B is a side view of the magnetic sensor 200 viewed from the Z direction. In FIG. 5 and FIGS. 6A and 6B, the controller 102 and the reference sensor 104 are not shown.

In the magnetic sensor 200 according to the second embodiment, the magnetoresistive element units 10A to 10E are arrayed to form a laminate 201, and a part of silicon substrates 12b to 12e and 22a to 22d constituting the magnetoresistive element units 10A to 10E and a part of the adjacent silicon substrates 12b to 12e and 22a to 22d constituting the magnetoresistive element units 10A to 10E are arranged so as to overlap in the direction orthogonal to the direction in which the magnetoresistive element units 10A to 10E are arrayed (XY direction). The surface facing the measurement sample 6 in the magnetic sensor 200 is a surface 203 parallel to the direction in which the magnetoresistive element units 10A to 10E are arrayed.

The first magnetoresistive elements 1a to 1e and the second magnetoresistive elements 2a to 2e have the same configurations as the first and second magnetoresistive elements 1 and 2 according to the first embodiment, respectively, except that they are in a rectangular shape when viewed from a direction orthogonal to the plane direction.

The first magnetoresistive elements 1a to 1e are arranged so that the longitudinal directions in the plane direction are along the X direction. The first magnetoresistive elements 1b and 1c are arranged in the Y direction so that their plane directions are parallel to each other. Accordingly, the first magnetoresistive elements 1b and 1c are provided in the same position in the Z direction, although the first magnetic thin films 140b and 140c are disposed opposite to each other. Similarly, the first magnetoresistive elements 1d and 1e are arranged in the Y direction so that their plane directions are parallel to each other. Accordingly, the first magnetoresistive elements 1d and 1e are provided in the same position in the Z direction, although the first magnetic thin films 140d and 140e are disposed opposite to each other.

The second magnetoresistive elements 2a to 2e are arranged so that the longitudinal directions in the plane direction are along the Y direction. The second magnetoresistive elements 2a and 2b are arranged in the X direction so that their plane directions are parallel to each other. Accordingly, the second magnetoresistive elements 2a and 2b are provided in the same position in the Z direction, although the second magnetic thin films 240a and 240b are disposed opposite to each other. Similarly, the second magnetoresistive elements 2c and 2d are arranged in the X direction so that their plane directions are parallel to each other. Accordingly, the second magnetoresistive elements 2c and 2d are provided in the same position in the Z direction, although the second magnetic thin films 240c and 240d are disposed opposite to each other.

The first and second magnetoresistive elements 1a to 1e and 2a to 2e are arrayed in the Z direction with the insulating layers 3a to 3e therebetween. To be specific, as shown in FIG. 5 and FIGS. 6A and 6B, the first magnetoresistive element 1a/the insulating layer 3a/the second magnetoresistive elements 2a and 2b/the insulating layer 3b/the first magnetoresistive elements 1b and 1c/the insulating layer 3c/the second magnetoresistive elements 2c and 2d/the insulating layer 3d/the first magnetoresistive elements 1d and 1e/the insulating layer 3e/the second magnetoresistive element 2e are disposed in this order in the Z direction.

Hence, the first magnetoresistive element 1a, the insulating layer 3a, and the second magnetoresistive element 2a constitute the magnetoresistive element unit 10A; and the second magnetoresistive element 2b, the insulating layer 3b, and the first magnetoresistive element 1b constitute the magnetoresistive element unit 10B; the first magnetoresistive element 1c, the insulating layer 3c, and the second magnetoresistive element 2c constitute the magnetoresistive element unit 10C; the second magnetoresistive element 2d, the insulating layer 3d, and the first magnetoresistive element 1d constitute the magnetoresistive element unit 10D; and the first magnetoresistive element 1e, the insulating layer 3e, and the second magnetoresistive element 2e constitute the magnetoresistive element unit 10E.

As described above, in the magnetic sensor 200 according to the second embodiment, a part of silicon substrates 12b to 12e and 22a to 22d constituting the magnetoresistive element units 10A to 10E and a part of the adjacent silicon substrates 12b to 12e and 22a to 22d constituting the magnetoresistive element units 10A to 10E are arranged so as to overlap in the direction orthogonal to the array direction, so that the plurality of magnetoresistive element can be arrayed more densely with respect to the measurement sample. Hence, shifts in the detection position of each magnetoresistive element can be suppressed and shifts in the detection timing can also be suppressed by simultaneously detecting the magnetic field intensity through the arrayed magnetoresistive elements. Therefore, measurement can be performed with higher accuracy and higher spatial resolution.

Although the laminate 201 consists of an array of five magnetoresistive element units 10A to 10E in the second embodiment described above, this is not necessarily the case: the number of magnetoresistive element units in the array may be 2 to 4, or 6 or more.

Third Embodiment

The third embodiment of the magnetic sensor of the present invention will be described below with reference to FIG. 7. Since the configuration other than that described below is substantially the same as that of the magnetic sensor 100 of the first embodiment, the same components are denoted by the same reference numerals and detailed description thereof will be omitted.

Figure 7:
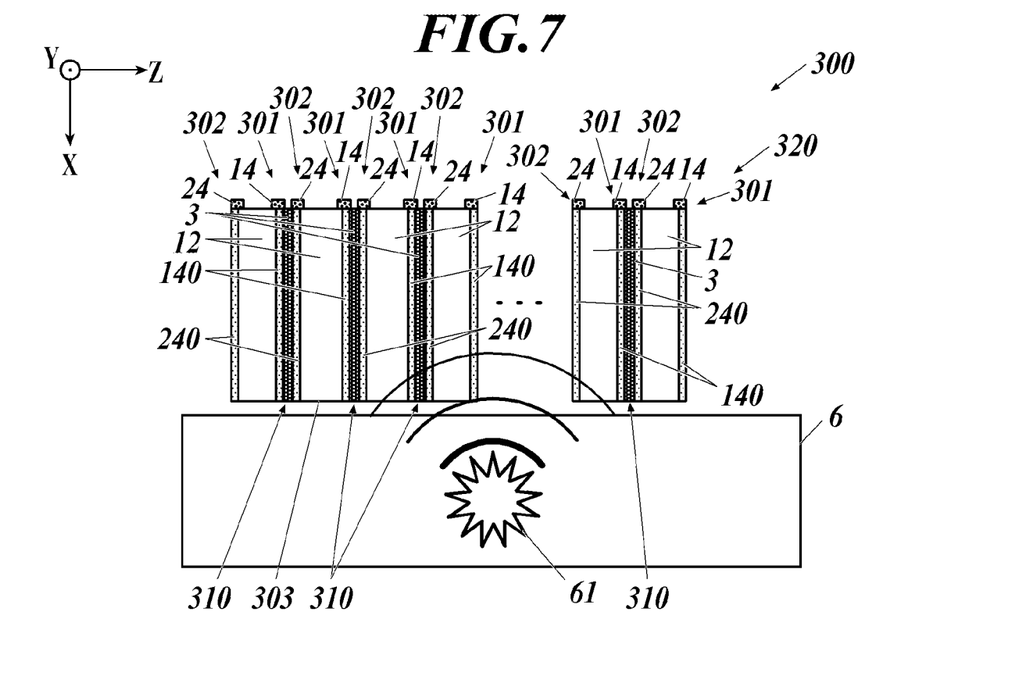
FIG. 7 is a schematic configuration diagram showing a magnetic sensor according to the third embodiment.

FIG. 7 is a schematic configuration diagram showing a magnetic sensor 300 of the third embodiment. In FIG. 7, the controller 102 and the reference sensor 104 are not shown.

In the magnetic sensor 300 according to the third embodiment, the first magnetic thin film 140 having the detection axis in the first direction (X direction) and the second magnetic thin film 240 having the detection axis in the second direction (X direction) are provided on both surfaces of the silicon substrate 12, thereby forming the first and second magnetoresistive elements 301 and 302 in one piece. In addition, a plurality of silicon substrates 12 configured as described above are arrayed so that the surface adjacent to the first magnetic thin film 140 and the surface adjacent to the second magnetic thin film 240 face each other, thereby forming a plurality of magnetoresistive element units 310. In addition, the insulating layer 3 is provided between the adjacent silicon substrates 12, whereby a plurality of silicon substrates 12 are integrated to form a laminate 320. The surface facing the measurement sample 6 in the magnetic sensor 300 is a surface 303 parallel to the array direction of the laminate 320. The silicon substrate 12 is provided with electrode layers 14 and 24 for extracting the magnetic field intensity detected by the first and second magnetic thin films 140 and 240 to the outside.

As described above, in the magnetic sensor 300 according to the third embodiment, the first magnetic thin film 140 having the detection axis in the first direction and the second magnetic thin film 240 having the detection axis in the second direction are provided on both sides of the silicon substrate 12, whereby the first magnetoresistive element 301 and the second magnetoresistive element 302 are formed, and the plurality of silicon substrates 12 are arrayed so that the surface adjacent to the first magnetic thin film 140 and the surface adjacent to the second magnetic thin film 240 face each other, whereby the plurality of magnetoresistive element units 310 are formed, so that the plurality of magnetoresistive elements can be arrayed more densely with respect to the measurement sample. Hence, shifts in the detection position of each magnetoresistive element can be suppressed and shifts in the detection timing can also be suppressed by simultaneously detecting the magnetic field intensity through the arrayed magnetoresistive elements. Therefore, measurement can be performed with higher accuracy and higher spatial resolution.

Fourth Embodiment

The fourth embodiment of the magnetic sensor of the present invention will be described below with reference to FIG. 8. Since the configuration other than that described below is substantially the same as that of the magnetic sensor 100 of the first embodiment, the same components are denoted by the same reference numerals and detailed description thereof will be omitted.

Figure 8:
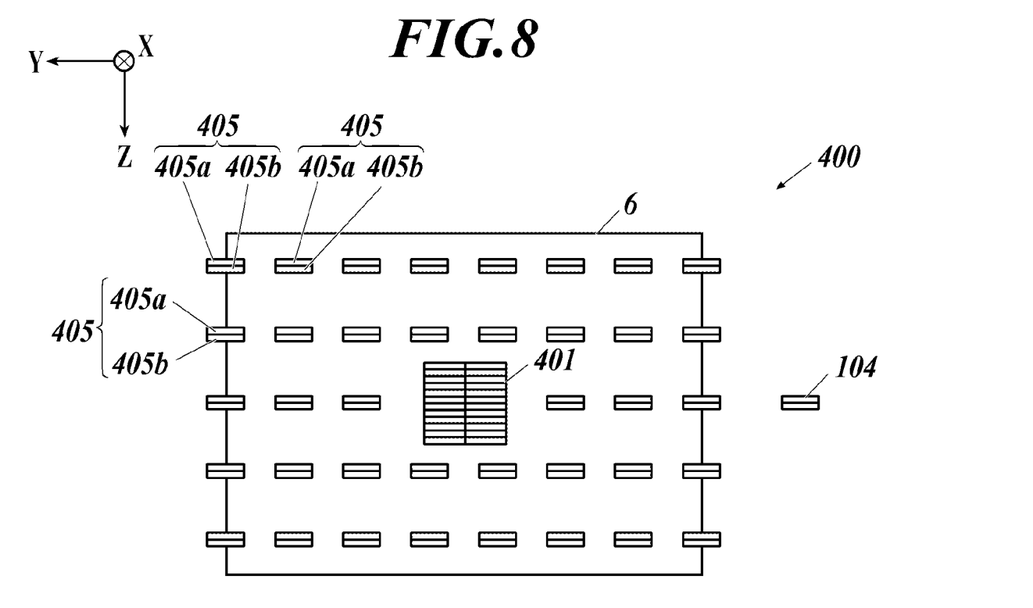
FIG. 8 is a plan view showing a schematic configuration of a magnetic sensor according to the fourth embodiment.

FIG. 8 is a plan view showing a schematic configuration of the magnetic sensor 400 and the measurement sample 6 of the fourth embodiment. In FIG. 8, the controller 102 is not shown.

The magnetic sensor 400 according to the fourth embodiment includes a laminate 401 consisting of an array of magnetoresistive element units 10, a reference sensor 104, and a plurality of units 405 distributed around the laminate 401. The laminate 401 is formed by providing two rows in the Y direction so that magnetoresistive element units 10 arrayed in the Z direction are in contact with each other.

The unit 405 consists of peripheral magnetoresistive elements 405a and 405b facing each other with an insulating layer (not shown) therebetween, and the peripheral magnetoresistive elements 405a and 405b have the same configurations as the aforementioned first and second magnetoresistive elements 1 and 2, respectively. Therefore, the unit 405 has the same configuration as the magnetoresistive element unit 10.

As shown in FIG. 8, the plurality of units 405 are distributed around the laminate 401 as viewed from the X direction and over the entire surface of the measurement sample 6 facing the laminate 401 and the periphery thereof. In addition, it is preferable that 5 to 20 of the plurality of units 405 be arranged vertically and horizontally as viewed from the X direction in terms of cost effectiveness. For example, when five units 405 are arranged vertically and horizontally, signal outputs can be obtained from a total of 25 points, and when 20 units 405 are arranged vertically and horizontally, signal outputs can be obtained from a total of 400 points. In addition, although the gap between the units 405 affects the detection accuracy of the magnetic field distribution, it is more cost-effective to arrange them coarsely to some extent than to arrange them densely. For example, when the measurement sample 6 is 20 cm square, arranging 20 units 405 at equal intervals in the measurement surface of the measurement sample 6 makes the distance between the units 405 about 1 cm. With the configuration using this arrangement, the approximate position can be specified if the spherical abnormal metal 61 has a diameter $\phi$ of about 100 μm.

Further, the plurality of units 405 are arranged in the same direction as the magnetoresistive element units 10 constituting the laminate 401, that is, in the direction in which the plane direction of the unit 405 is parallel to the XY plane.

The plurality of units 405 are configured to be individually movable, and the distance between the units 405, the distance from the laminate 401, the distance from the measurement sample 6, and the like are adjustable according to the size of the measurement sample 6.

For measurement using the magnetic sensor 400, the units 405 are disposed so that their surfaces facing the measurement sample 6 are flush with the surface of the laminate 401 facing the measurement sample 6 and they are close to the measurement sample 6. After obtaining rough magnetic field distribution information on the entire measurement sample 6 through the laminate 401 and the units 405 in this way, a portion of the measurement sample 6 to be measured in more detail is specified and the laminate 401 is moved so as to be opposed to the portion, so that measurement can be performed again. Hence, the position of the internal defect of the measurement sample 6 can be easily specified, and detailed magnetic field information on the internal defect can be acquired.

The unit 405 can also be used for the same purpose as the reference sensor 104. In other words, since the units 405 are configured to be individually movable, the magnetic field intensity may be detected after the units 405 have been moved to a predetermined position, and the noise component caused by the external environment may be specified based on the detection results.

As described above, according to the fourth embodiment, the plurality of peripheral magnetoresistive elements 405a and 405b distributed around the laminate 401 consisting of the plurality of magnetoresistive element units 10 are provided; hence, the position of the internal defect of the measurement sample 6 can be easily specified, and detailed magnetic field information on the internal defect can be acquired.

Although, in the fourth embodiment, the unit 405 has the same configuration as the magnetoresistive element unit 10, this is not necessarily the case. For example, the unit 405 may have a size and shape different from those of the magnetoresistive element unit 10. Therefore, the peripheral magnetoresistive elements 405a and 405b may be different from the first and second magnetoresistive elements 1 and 2.

Although the peripheral magnetoresistive elements 405a and 405 constituting the unit 405 have detection axes in the X and Y directions, respectively in the fourth embodiment, this is not necessarily the case. For example, a peripheral magnetoresistive element having a detection axis in the Z direction may be further provided.

Fifth Embodiment

The fifth embodiment of the magnetic sensor of the present invention will be described below with reference to FIG. 9. Since the configuration other than that described below is substantially the same as that of the magnetic sensor 400 of the fourth embodiment, the same components are denoted by the same reference numerals and detailed description thereof will be omitted.

Figure 9:
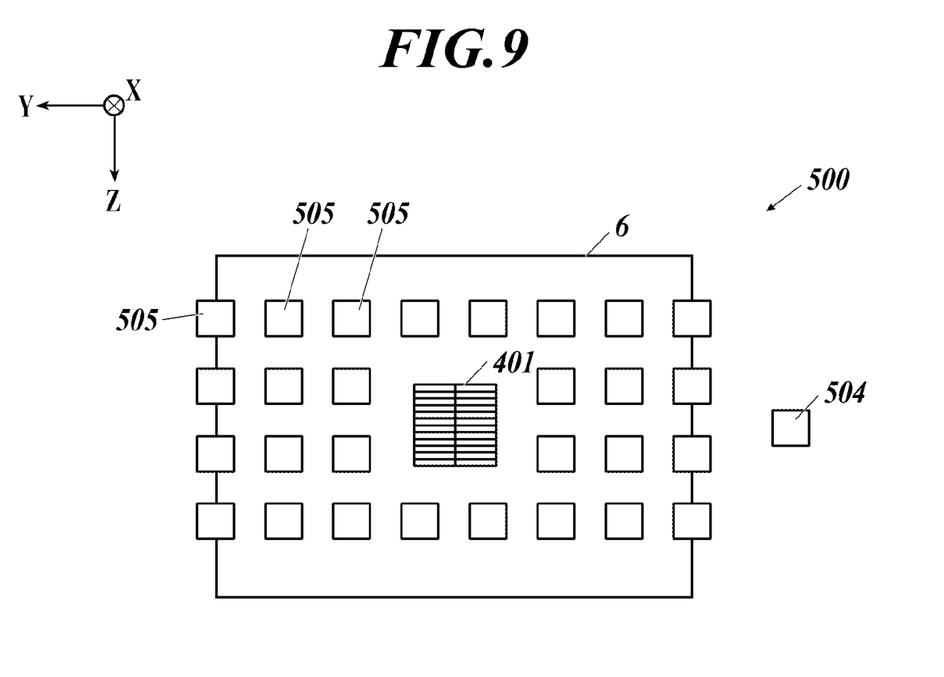
FIG. 9 is a plan view showing a schematic configuration of a magnetic sensor according to the fifth embodiment.

FIG. 9 is a plan view showing a schematic configuration of the magnetic sensor 500 and the measurement sample 6 of the fifth embodiment. In FIG. 9, the controller 102 is not shown.

In the magnetic sensor 500 according to the fifth embodiment, the plane directions of a reference sensor 504 and a plurality of units 505 distributed around the laminate 401 are oriented in a direction different from the magnetoresistive element units 10 constituting the laminate 401, that is, in a direction parallel to the YZ plane. The reference sensor 504 and the units 505 have the same configuration as the reference sensor 104 and the units 405 described above except the array directions. In addition, the reference sensor 504 may be disposed so that one of the both surfaces of the reference sensor 504 faces the X direction. Further, the unit 505 may be disposed so that one of the both surfaces of the unit 505 faces the X direction, which is preferably common to the plurality of units 505.

As described above, according to the fifth embodiment, the plurality of units 505 that are distributed around the laminate 401 consisting of the plurality of magnetoresistive element units 10 are provided; hence, the position of the internal defect of the measurement sample 6 can be easily specified, and detailed magnetic field information on the internal defect can be acquired.

INDUSTRIAL APPLICABILITY

The present invention can be used for a magnetic sensor.

REFERENCE SIGNS LIST 1, 1a to 1e, 301 first magnetoresistive element
2, 2a to 2e, 302 second magnetoresistive element
3, 3a to 3e insulation layer
10, 10A to 10E magnetoresistive element unit
12, 12a to 12e, 22a to 22e silicon substrate (substrate)
100, 200, 300, 400, 500 magnetic sensor
102 control unit (computing unit, specifying unit)
103, 203, 303 surface
104a, 104b external magnetoresistive element
140, 140a to 140e first magnetic thin film
240, 240a to 240e second magnetic thin film
310 magnetoresistive element unit
405a, 405b peripheral magnetoresistive element

The invention claimed is:

1. A magnetic sensor, comprising:
a plurality of magnetoresistive element units, each of which including a flat-surface-type first magnetoresistive element having a detection axis in a first direction and a flat-surface-type second magnetoresistive element having a detection axis in a second direction different from the first direction, the second direction being orthogonal to the first direction,
wherein the first magnetoresistive element and the second magnetoresistive element of each of the magnetoresistive element units are arranged so as to face each other,
wherein the plurality of magnetoresistive element units are arrayed in a direction orthogonal to flat surfaces of the first magnetoresistive element and the second magnetoresistive element of each of the magnetoresistive element units, and
wherein other surfaces of the first magnetoresistive element and the second magnetoresistive element of each of the magnetoresistive element units facing a measurement sample constitute a surface parallel to the direction in which the magnetoresistive element units are arrayed.

2. The magnetic sensor according to claim 1, wherein an insulating layer is provided between the first magnetoresistive element and the second magnetoresistive element.

3. The magnetic sensor according to claim 1, wherein the magnetoresistive element units adjacent in the array direction are in contact with each other.

4. The magnetic sensor according to claim 1, wherein a part of a substrate constituting the magnetoresistive element unit and a part of a substrate constituting the adjacent magnetoresistive element unit are arranged so as to overlap with each other in a direction orthogonal to the array direction.

5. The magnetic sensor according to claim 1, wherein a first magnetic thin film having a detection axis in the first direction and a second magnetic thin film having a detection axis in the second direction are provided on both surfaces of each substrate, whereby the first magnetoresistive element and the second magnetoresistive element are formed, and
wherein the plurality of substrates are arrayed so that a surface adjacent to the first magnetic thin film and a surface adjacent to the second magnetic thin film face each other, whereby the plurality of magnetoresistive element units are formed.

6. The magnetic sensor according to claim 1, further comprising a computing unit that derives a magnetic field intensity in the array direction on the basis of detection results given by the plurality of magnetoresistive element units.

7. The magnetic sensor according to claim 1, further comprising:
an external magnetoresistive element that detects external magnetic field intensity; and
a specifying unit that specifies a noise component caused by an external environment on the basis of detection results given by the external magnetoresistive element.

8. The magnetic sensor according to claim 1, further comprising a plurality of peripheral magnetoresistive elements distributed around the plurality of magnetoresistive element units.

9. The magnetic sensor according to claim 1, wherein the measurement sample comprises a battery having flat surfaces.

* * * * *